United States Patent
Higashino

(10) Patent No.: US 7,563,642 B2
(45) Date of Patent: Jul. 21, 2009

(54) MANUFACTURING METHOD OF A SEMICONDUCTOR DEVICE

(75) Inventor: Tomoko Higashino, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 365 days.

(21) Appl. No.: 11/657,009

(22) Filed: Jan. 24, 2007

(65) Prior Publication Data
US 2007/0218651 A1 Sep. 20, 2007

(30) Foreign Application Priority Data
Mar. 14, 2006 (JP) .............................. 2006-068448

(51) Int. Cl.
*H01L 21/00* (2006.01)
(52) U.S. Cl. ................. 438/113; 438/464; 257/E21.599
(58) Field of Classification Search .................. 438/113, 438/464
See application file for complete search history.

(56) References Cited

U.S. PATENT DOCUMENTS

| | | | |
|---|---|---|---|
| 5,882,956 A * | 3/1999 | Umehara et al. | 438/114 |
| 6,478,918 B2 * | 11/2002 | Bennett et al. | 156/248 |
| 6,589,809 B1 * | 7/2003 | Koopmans | 438/68 |
| 6,908,784 B1 * | 6/2005 | Farnworth et al. | 438/106 |
| 6,943,094 B2 * | 9/2005 | Koopmans | 438/462 |
| 7,051,428 B2 * | 5/2006 | Jeong et al. | 29/729 |
| 7,265,035 B2 * | 9/2007 | Honma et al. | 438/464 |
| 7,410,831 B2 * | 8/2008 | Sakaya et al. | 438/113 |
| 2007/0026572 A1 * | 2/2007 | Hatakeyama et al. | 438/113 |

FOREIGN PATENT DOCUMENTS

JP 2005-228794 A 8/2005

* cited by examiner

*Primary Examiner*—David A Zarneke
(74) *Attorney, Agent, or Firm*—Miles & Stockbridge P.C.

(57) ABSTRACT

A semiconductor wafer is mounted onto a dicing tape, the dicing tape comprising a first tape easy to stretch and a second tape difficult to stretch and provided on the first tape. Thereafter, a ring-shaped jig is mounted onto the dicing tape along the outer periphery of the semiconductor wafer and the semiconductor wafer is diced. Subsequently, the dicing tape is stretched from the outer periphery thereof to widen the spacing between adjacent chips. Thus, the dicing tape is stretched from its outer periphery in a state in which there are formed an area of the dicing tape underlying the semiconductor wafer and easy to stretch and an area of the dicing tape located along the outer periphery of the wafer and difficult to stretch. Consequently, the force of stretching the dicing tape is transmitted to the semiconductor wafer-mounted area of the first tape, thus permitting pickup of each chip in a sufficiently widened state of the spacing between adjacent chip-forming areas. The semiconductor device manufactured by this method is improved in reliability.

14 Claims, 16 Drawing Sheets

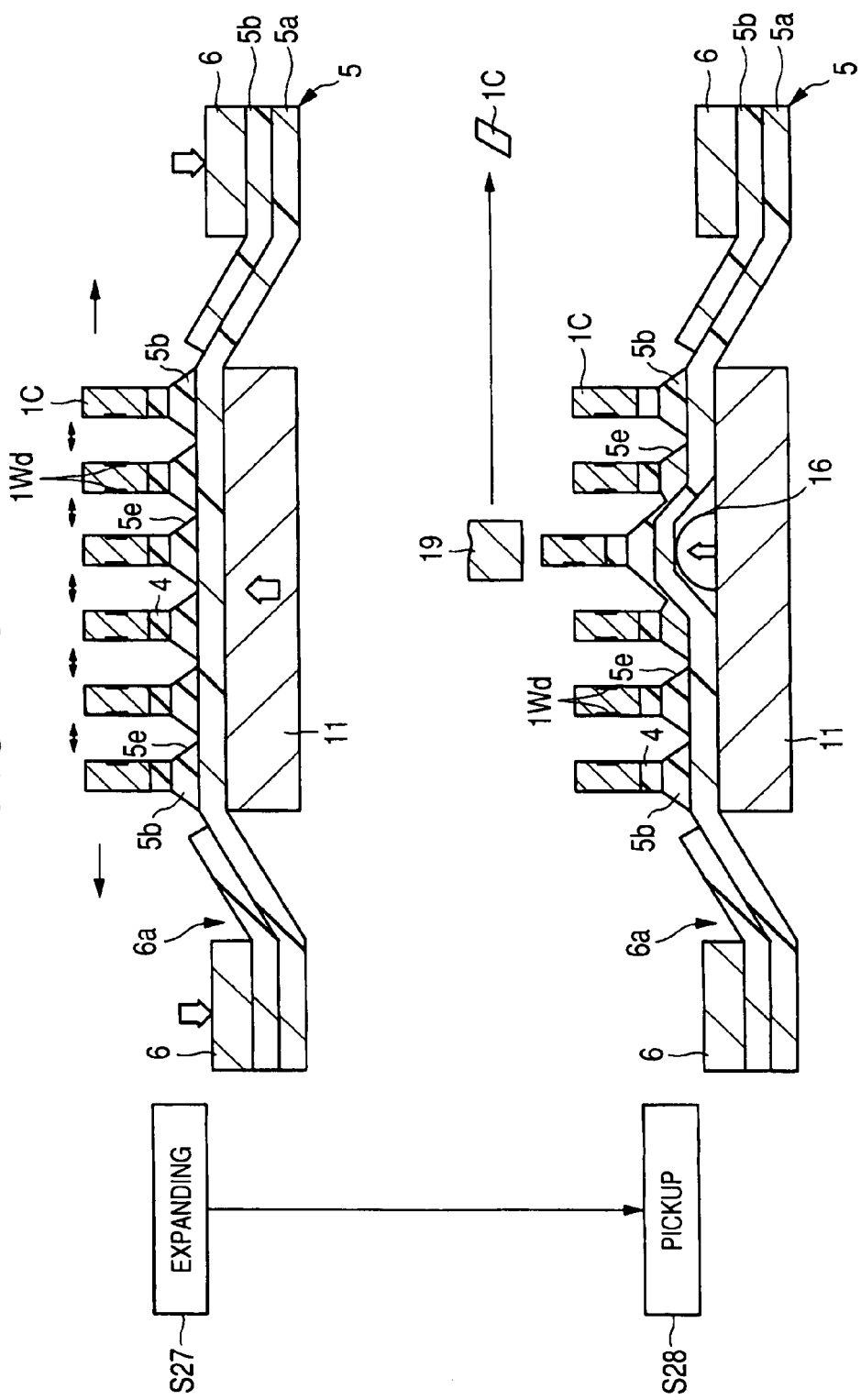

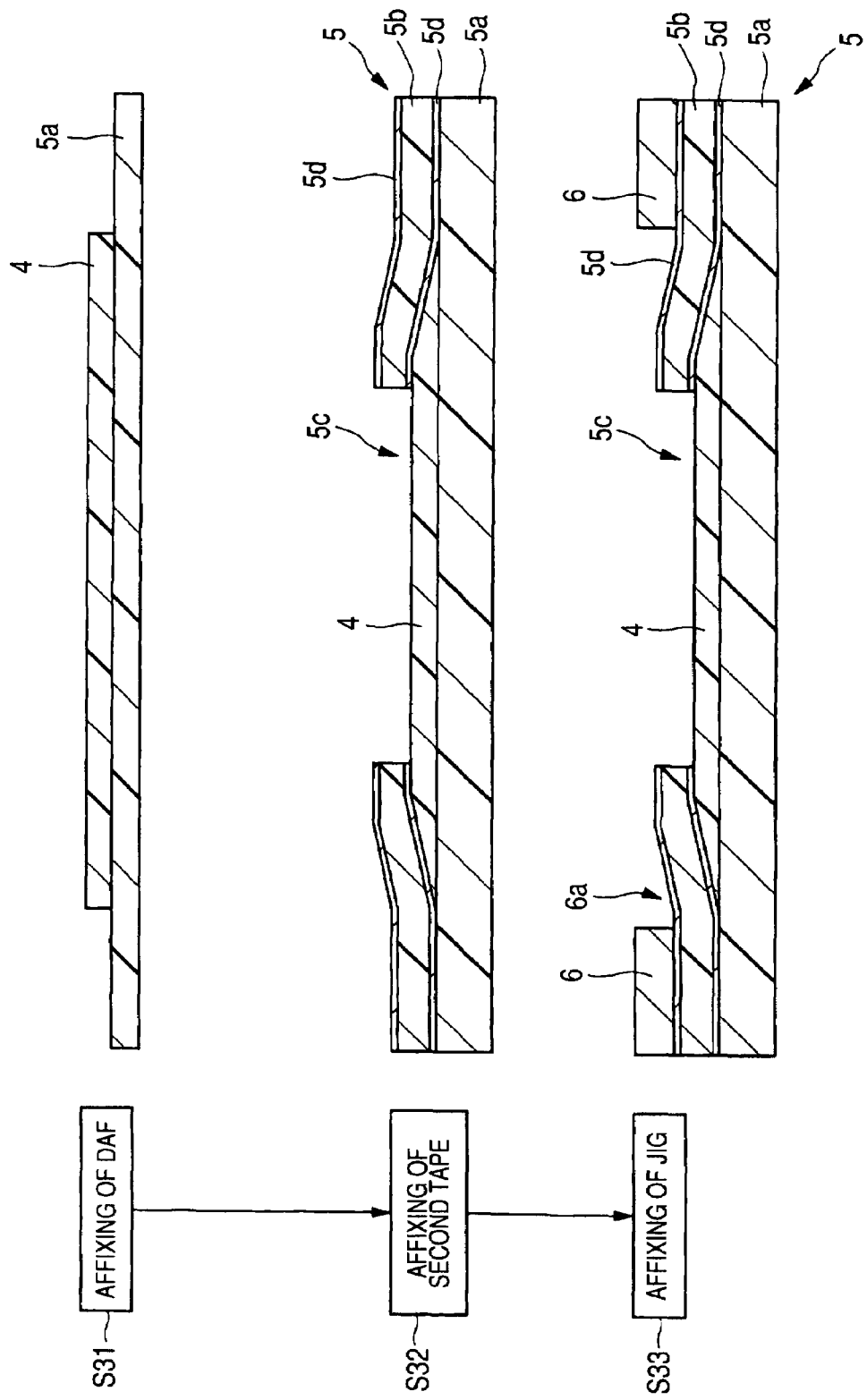

MANUFACTURING METHOD OF A SEMICONDUCTOR DEVICE

CROSS-REFERENCE TO RELATED APPLICATION

The present application claims priority from Japanese patent application No. 2006-68448 filed on Mar. 14, 2006, the content of which is hereby incorporated by reference into this application.

BACKGROUND OF THE INVENTION

The present invention relates to a semiconductor device manufacturing technique and particularly to a technique applicable effectively to a semiconductor device manufacturing method using a dicing tape.

There is known a technique comprising a step of mounting a wafer with a protective film affixed to a surface thereof and with a back surface thereof ground extremely thin to a first ring-shaped frame through a first adhesive sheet with the back surface up and dicing the wafer from the back surface side in this state and a step of turning the diced wafer upside down and re-affixing the wafer to a second ring-shaped frame through a second adhesive sheet (see, for example, Patent Literature 1).

[Patent Literature 1]
Japanese Unexamined Patent Publication
No. 2005-228794 (FIG. 1)

SUMMARY OF THE INVENTION

In a dicing step in a semiconductor device manufacturing process, a semiconductor wafer (hereinafter also referred to as "wafer") is cut along lattice-like areas called scribing areas on a main surface of the wafer to form semiconductor chips. For cutting the wafer there is used a disc-like cutting tool called a dicing blade. With the dicing blade, the wafer is divided (division) into individual pieces, thereafter the spacing between adjacent chips is expanded by an expanding method (expanding step) of expanding a wafer-holding dicing tape toward the outer periphery and then the chips are each picked up.

However, with the recent tendency to thinning the semiconductor wafer, there has been developed a technique adopting a laser dicing method as a substitute for the blade dicing method. The laser dicing method is disclosed also in Patent Literature 1 (Japanese Unexamined Patent Publication No. 2005-228794).

In the dicing step or the expanding step there is used a wafer-mounted dicing tape with a ring-shaped jig mounted along the outer periphery of the wafer. For avoiding interference with the dicing blade, the size of the ring-shaped jig itself is designed on the basis of the related standard. A margin of, for example, 25 mm is allowed for the distance between the wafer peripheral edge portion (end portion) and the ring-shaped jig.

Therefore, even if the laser dicing method is applied as the dividing means, the wafer is fixed to the dicing tape in a state in which a spacing of about 25 mm is present between the peripheral edge portion of the wafer and the ring-shaped jig. As a result, in the expanding step after the division into individual pieces, the force acting to stretch the dicing tape from the outer periphery is difficult to be transmitted to the wafer-mounted area and thus it is difficult to fully expand the spacing between adjacent chip-forming areas. This poses a problem.

Further, with the recent reduction in thickness of the semiconductor wafer, if a divided thin semiconductor chip is mounted through a paste material, the paste material is easy to crawl up onto a main surface of the semiconductor chip because the chip is thin. Consequently, in the case of a structure wherein semiconductor chips are stacked in multiple stages to cope with a higher density of a semiconductor device, the flatness becomes lower due to the paste material formed on the main surface of the semiconductor chip mounted in the first stage, thus causing a defective stack of the second-stage semiconductor chip.

In this connection, there is known a technique wherein a DAF (Die Attach Film) as a die bonding material formed as a film is affixed to a back surface of a semiconductor chip and the chip is mounted through the DAF. However, if the stretchability (stretch ratio) of DAF is high, the dividability of DAF tends to become poor. Therefore, as to a DAF having a relatively high stretchability, the application thereof to laser dicing is difficult. For this reason it is preferable that the DAF to be affixed to the back surface of the semiconductor chip be of a low stretchability taking the dividability thereof into account.

However, the width of cutting by means of a laser is about several microns, so in the expanding step it is difficult to widen the spacing between adjacent chip-forming areas to about the same degree as in the blade dicing method using a blade. Therefore, if there is used a DAF of a low stretchability, it becomes difficult to fully widen the spacing between adjacent chip-forming areas and this poses a problem.

If the spacing between adjacent chip-forming areas is not sufficiently wide, there is a possibility that, at the time of picking up a chip, the chip being picked up and the chip adjacent thereto may come into contact with each other, causing a chick crack. In the case of the blade dicing method, since a gap is formed between adjacent chip-forming areas to match the blade width prior to expanding, the problem of contact between adjacent chips has so far been difficult to occur even if the stretch ratio is low.

However, in the laser dicing method, a crushed layer is formed in the interior of a semiconductor wafer by the radiation of laser light, but the chip-forming areas are not separated until expanding, that is, they are in a mutually contacted state. Therefore, unless the spacing between adjacent chips is fully widened in the expanding step, there will occur contact between chips at the time of picking up a chip, resulting in a chip crack, which poses a problem.

Accordingly, it is an object of the present invention to provide a technique able to improve the reliability of a semiconductor device.

It is another object of the present invention to provide a technique able to increase the number of semiconductor chips obtained.

The above and other objects and novel features of the present invention will become apparent from the following description and the accompanying drawings.

The following is an outline of typical modes of the present invention as disclosed herein.

According to the present invention, a semiconductor wafer is mounted on a dicing tape, the dicing tape comprising a first tape having a first stretch ratio and a second tape having a second stretch ratio lower than the first stretch ratio and provided on the first tape, a jig mounted on the dicing tape along the outer periphery of the semiconductor wafer, then the semiconductor wafer is diced and the dicing tape is stretched from the outer periphery to widen the chip-to-chip spacing.

The following is a brief description of an effect obtained by the typical modes of the present invention as disclosed herein.

At the time of expanding after dicing, since the dicing tape is stretched in a state in which the dicing tape portion underlying the semiconductor wafer lies in the area of the first tape having the first stretch ratio and the second tape having the second stretch ratio lower than the first stretch ratio is disposed on the outer periphery of the first tape, the dicing tape stretching force is transmitted to the area of the first tape with the semiconductor wafer mounted thereon, so that it is possible to fully widen the spacing between adjacent chip-forming areas. As a result, it is possible to diminish interference between adjacent chips at the time of picking up a semiconductor chip and thereby improve the reliability of the semiconductor devices obtained.

BRIEF DESCRIPTION OF THE DRAWINGS

FIG. 18 is a sectional view showing an example of an expanding method and a pickup method both used in the semiconductor device manufacturing method of the second embodiment; and FIG. 19 is a manufacturing process flow chart showing a dicing tape forming method according to a modification of the present invention.

DETAILED DESCRIPTION OF PREFERRED EMBODIMENTS

Figure 1:
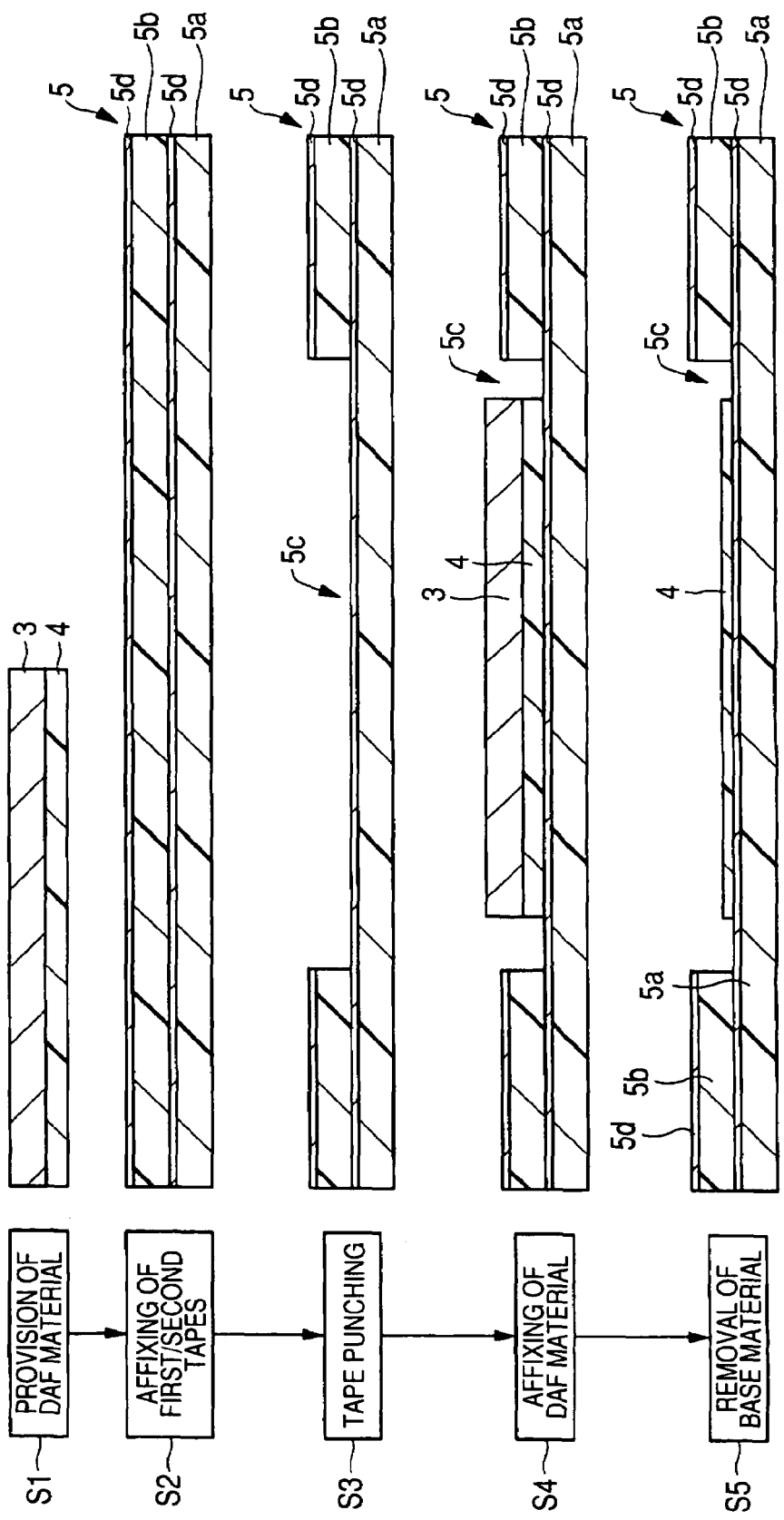
FIG. 1 is a manufacturing process flow chart showing an example of a method for forming a dicing tape used in a semiconductor device manufacturing method according to a first embodiment of the present invention.

In the following embodiments, as to the same or similar portions, repeated explanations thereof will be omitted in principle except where required.

Where required for convenience' sake, the following embodiments will each be described in a divided manner into plural sections or embodiments, but unless otherwise mentioned, they are not unrelated to each other but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

Embodiments of the present invention will be described in detail hereinunder with reference to the accompanying drawings. In all of the drawings for illustrating the embodiments, the members having the same functions are identified by the same reference numerals, and repeated explanations thereof will be omitted.

First Embodiment

Figure 2:
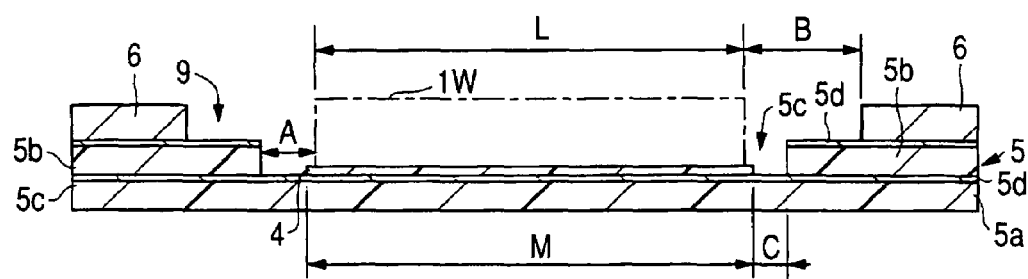
FIG. 2 is a sectional view showing a structural example wherein a jig is affixed to the dicing tape shown in FIG. 1.
Figure 3:
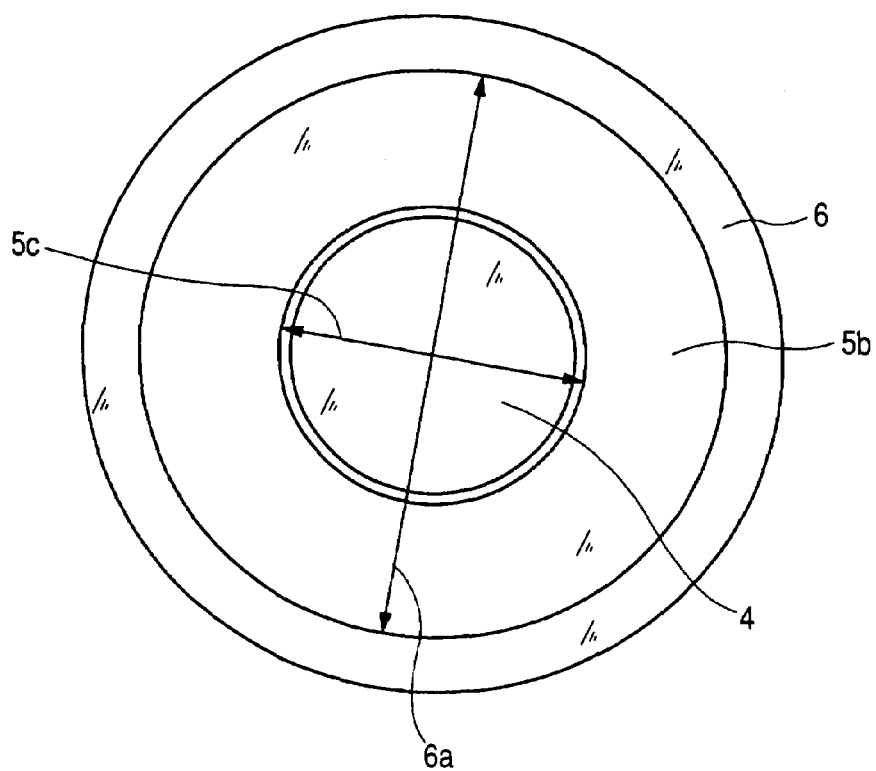
FIG. 3 is a plan view showing a structural example of the dicing tape with jig shown in FIG. 2.
Figure 4:
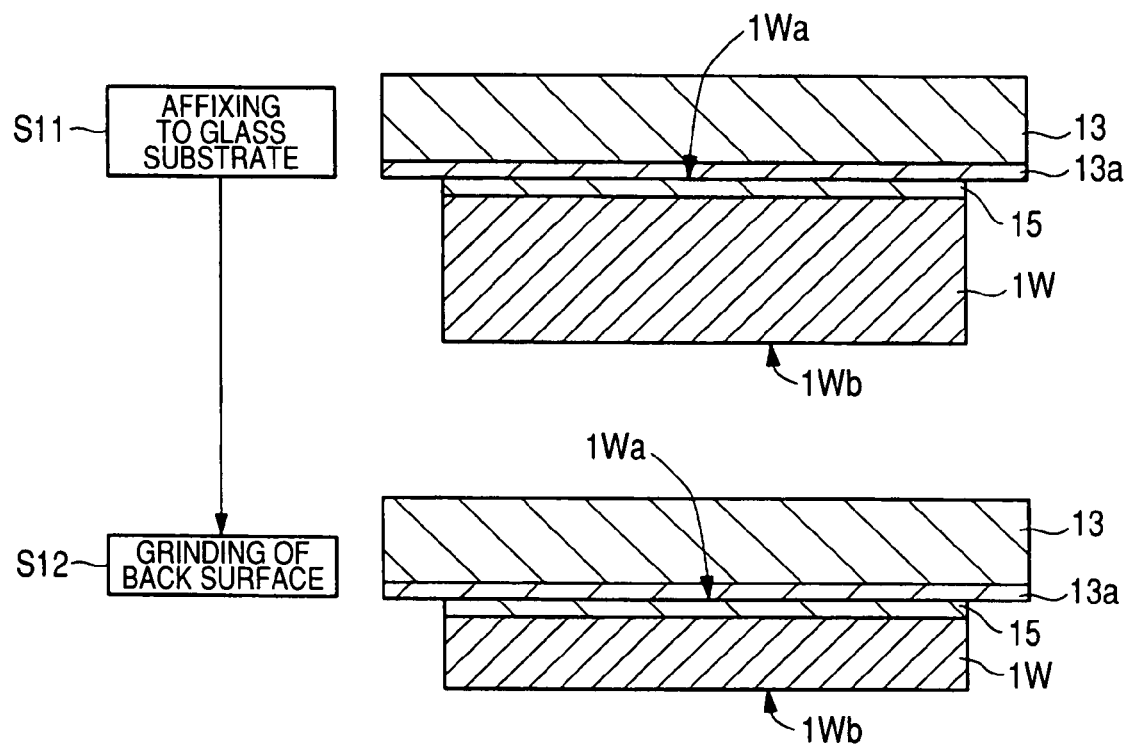
FIG. 4 is a sectional view showing an example of assembling operations up to grinding of a back surface in the semiconductor device manufacturing method of the first embodiment.
Figure 5:
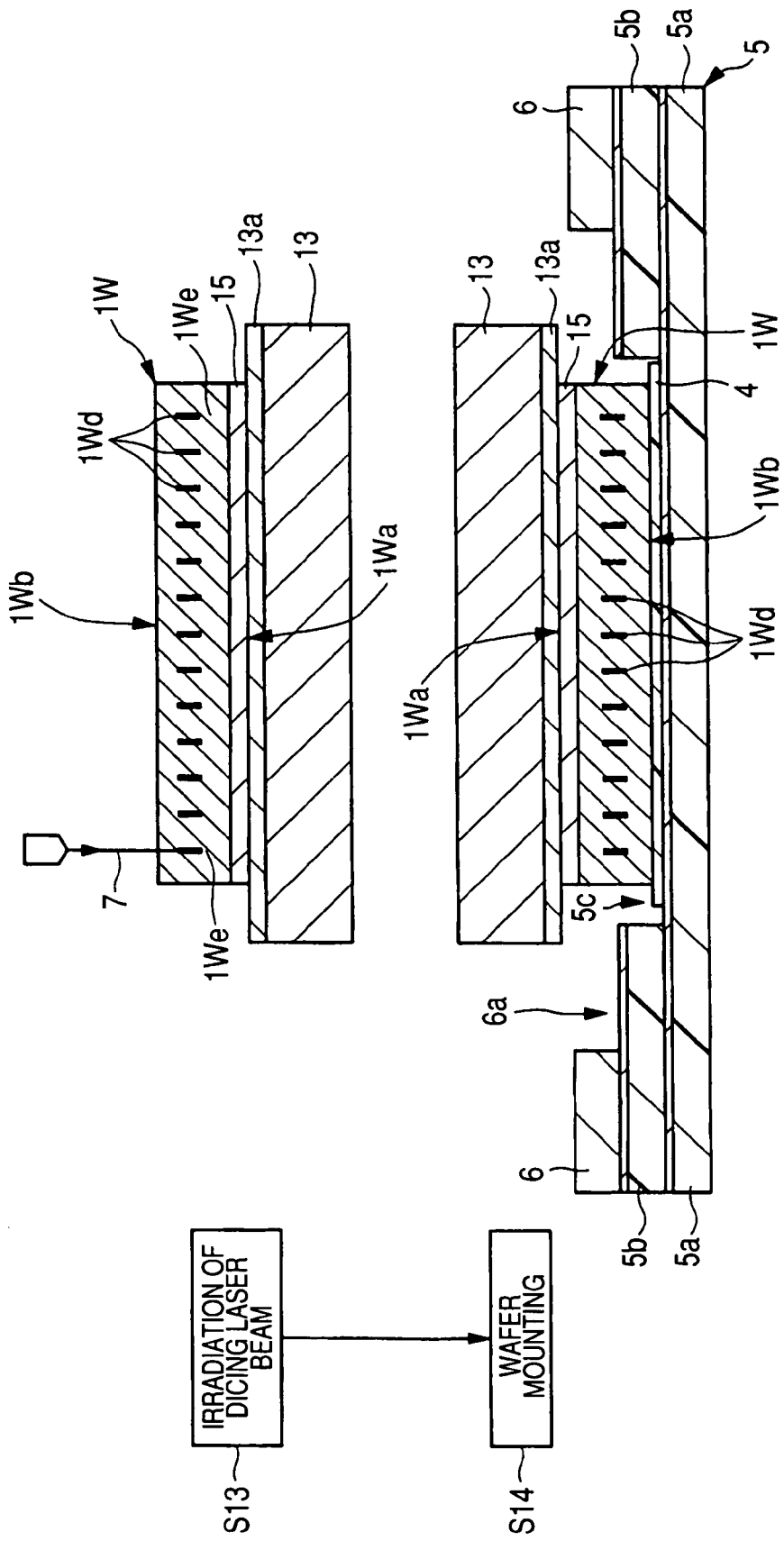
FIG. 5 is a sectional view showing an example of assembling operations up to wafer mounting in the semiconductor device manufacturing method of the first embodiment.
Figure 6:
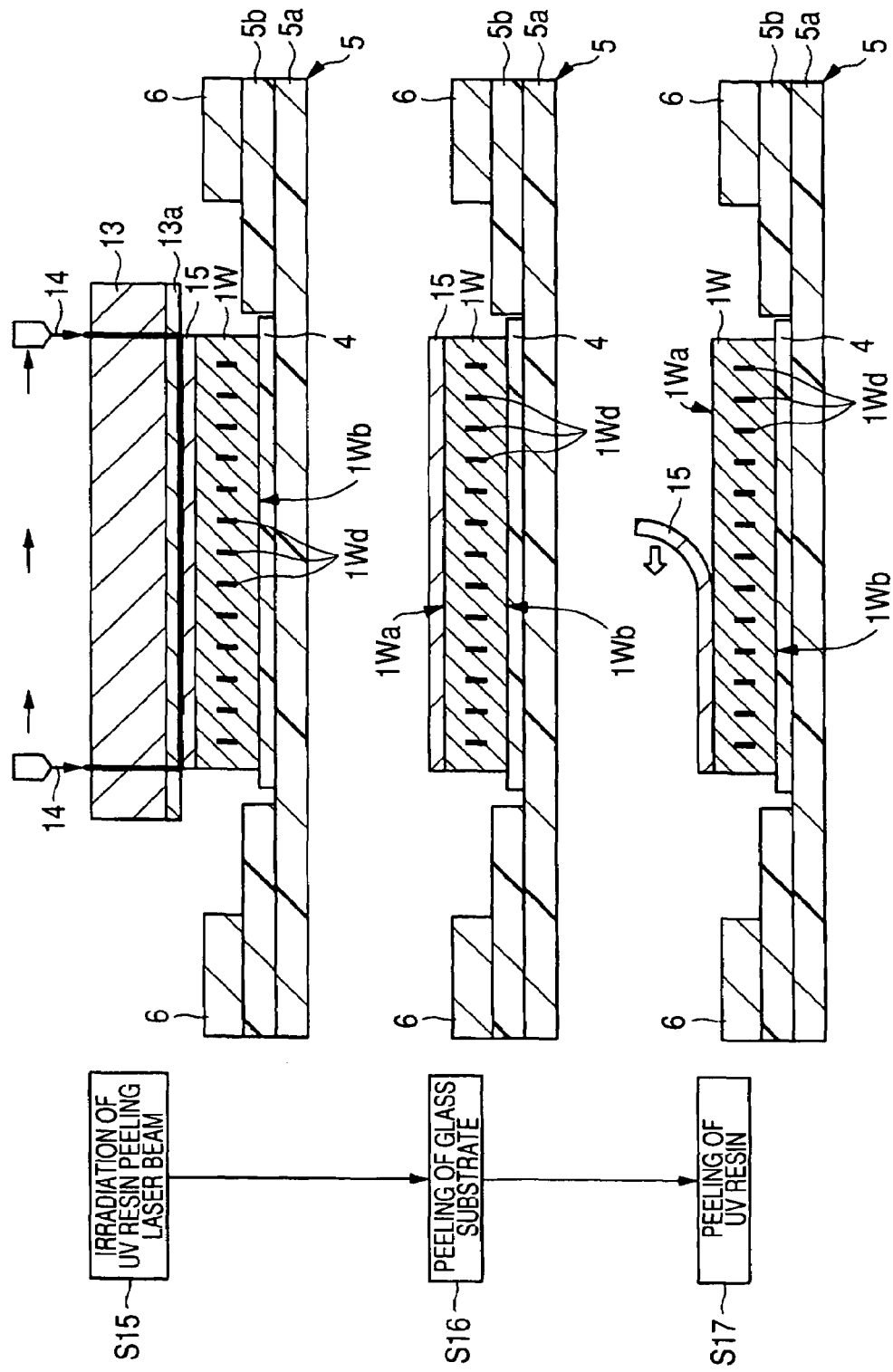
FIG. 6 is a sectional view showing an example of assembling operations up to peeling-off of a protective tape in the semiconductor device manufacturing method of the first embodiment.
Figure 7:
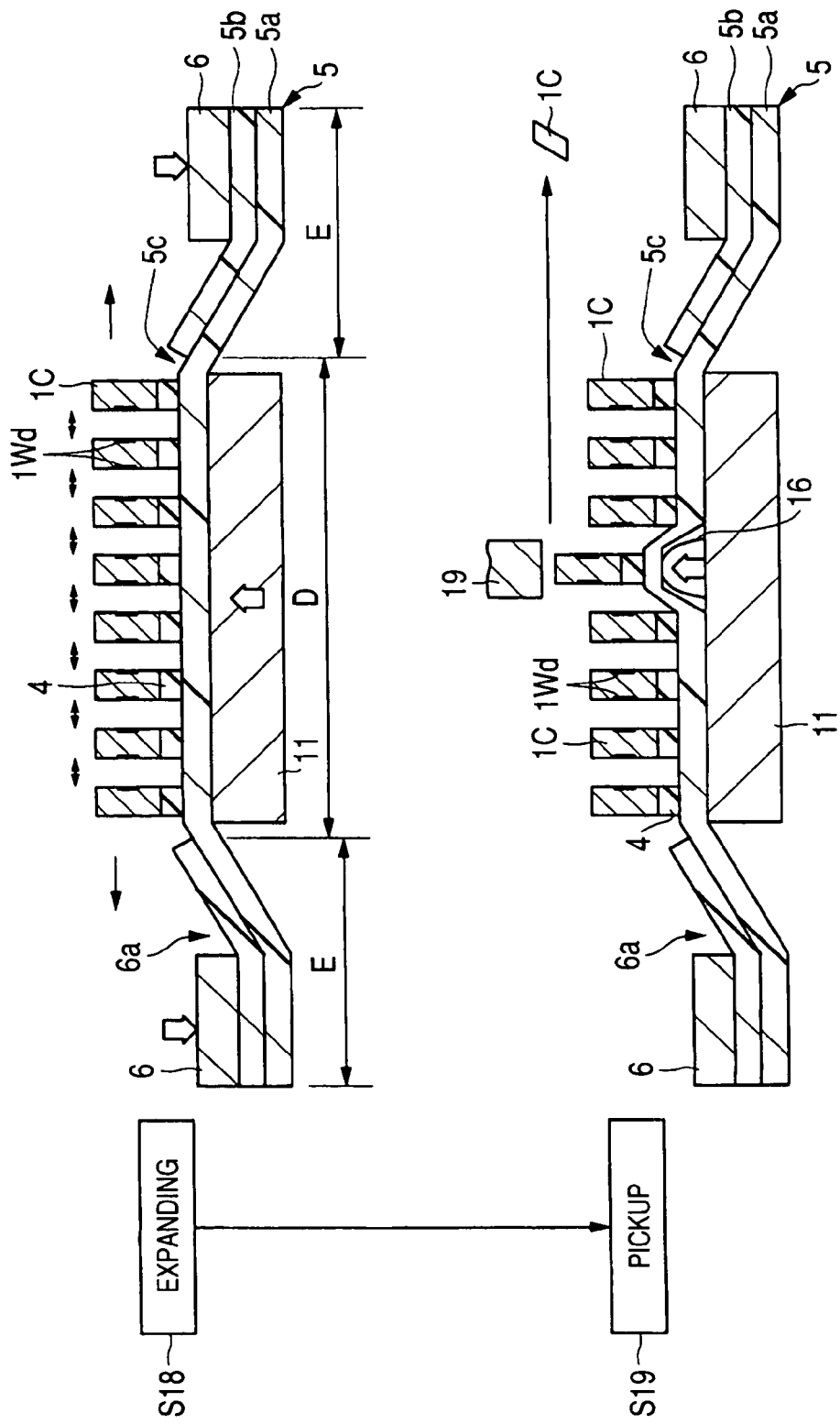
FIG. 7 is a sectional view showing an example of assembling operations up to pickup in the semiconductor device manufacturing method of the first embodiment.
Figure 8:
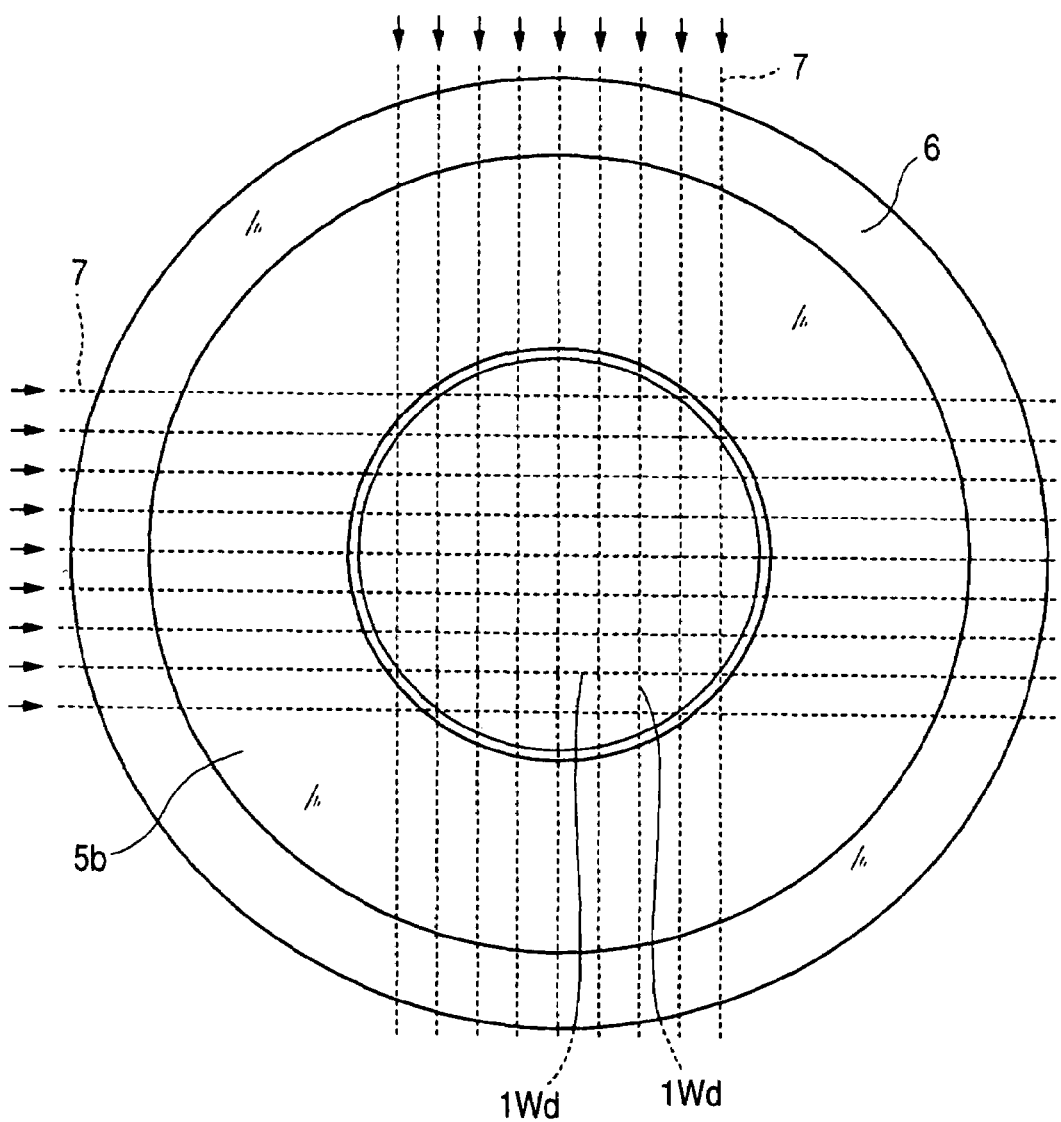
FIG. 8 is a plan view showing a structural example after laser dicing in the semiconductor device manufacturing method of the first embodiment.
Figure 9:
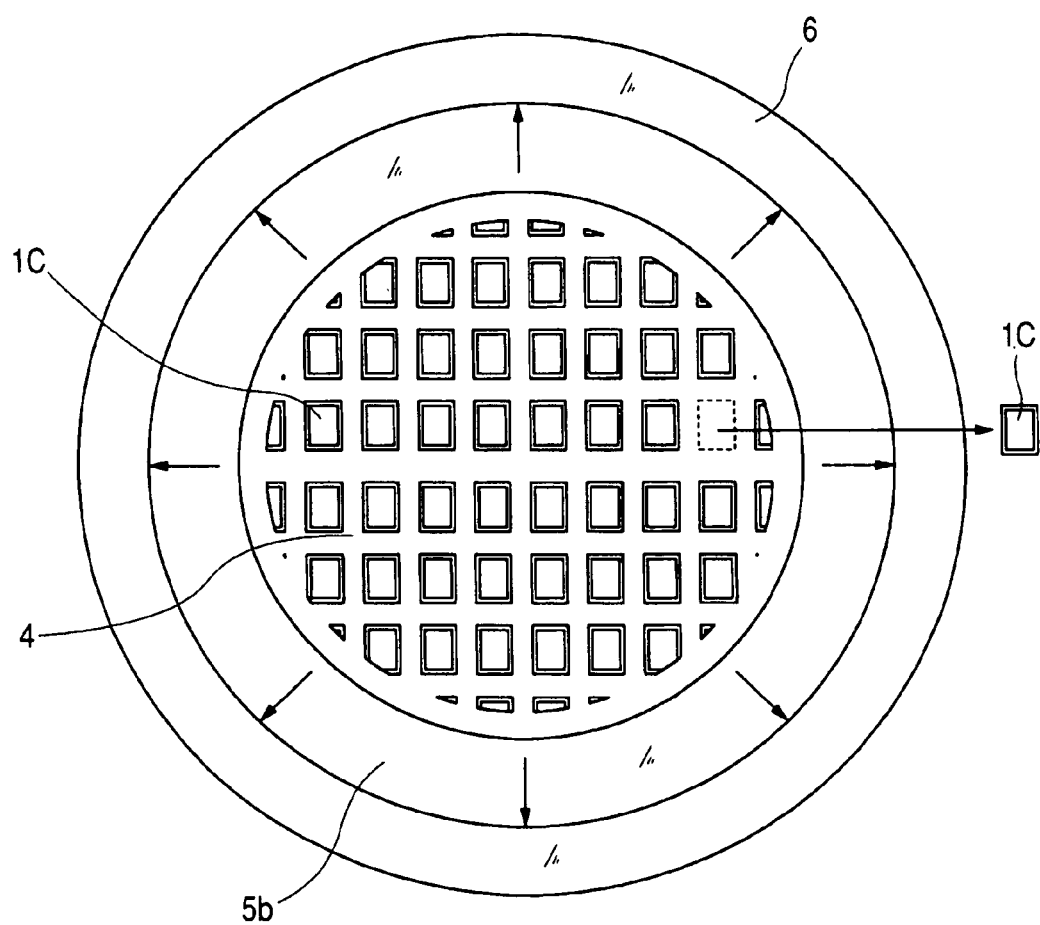
FIG. 9 is a plan view showing a structural example after expanding in the semiconductor device manufacturing method of the first embodiment.
Figure 10:
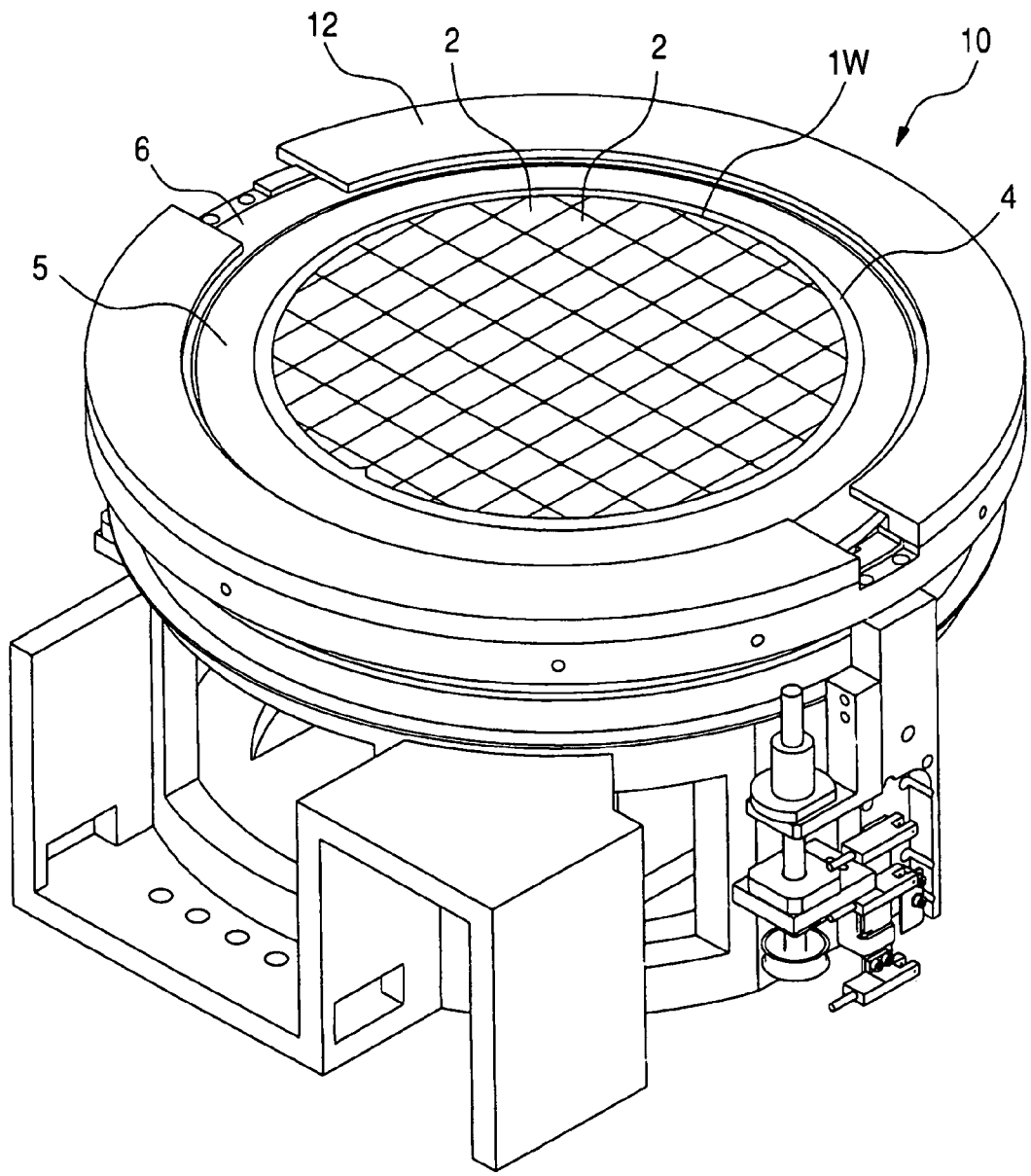
FIG. 10 is a perspective view showing a structural example of a pickup device used in the semiconductor device manufacturing method of the first embodiment.
Figure 11:
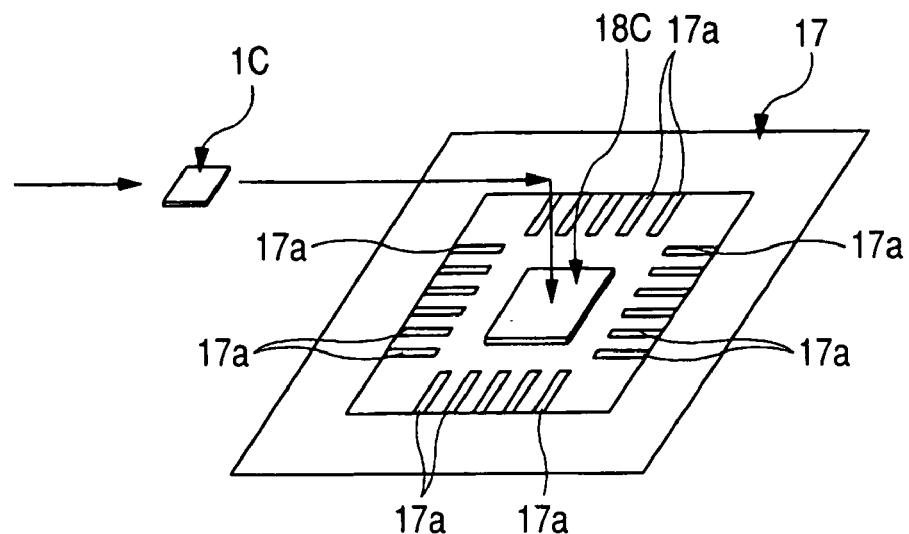
FIG. 11 is a perspective view showing an example of a die bonding method used in the semiconductor device manufacturing method of the first embodiment.
Figure 12:
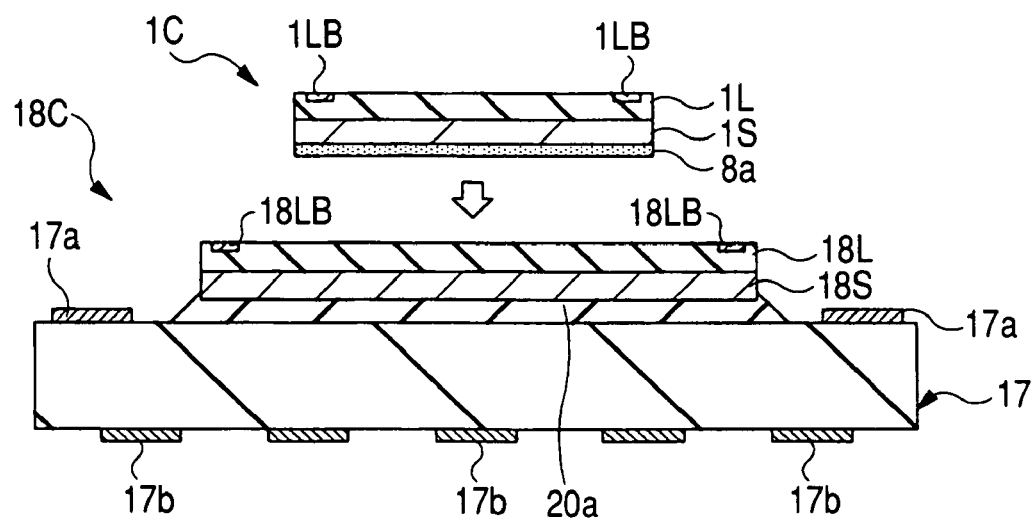
FIG. 12 is a sectional view showing an example of a die bonding method for a second-stage chip in the semiconductor device manufacturing method of the first embodiment.
Figure 13:
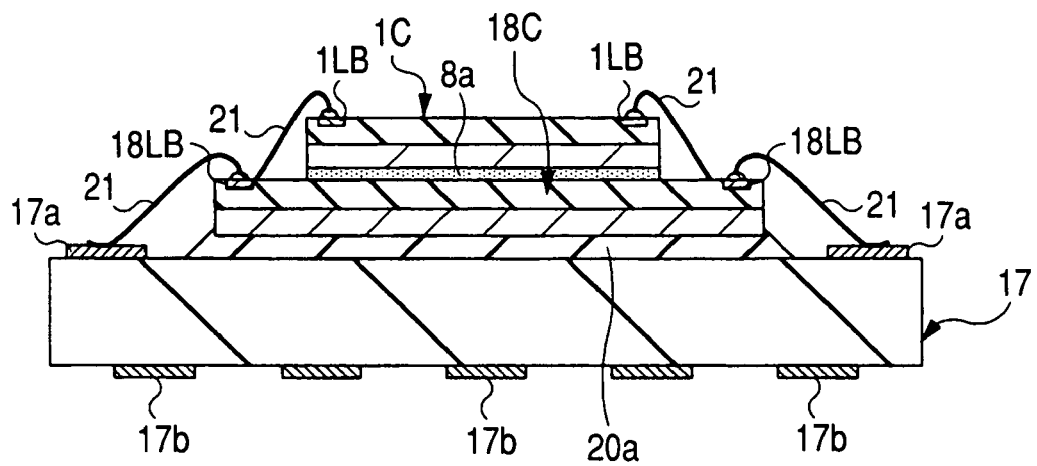
FIG. 13 is a sectional view showing a structural example after wire bonding in the semiconductor device manufacturing method of the first embodiment.
Figure 14:
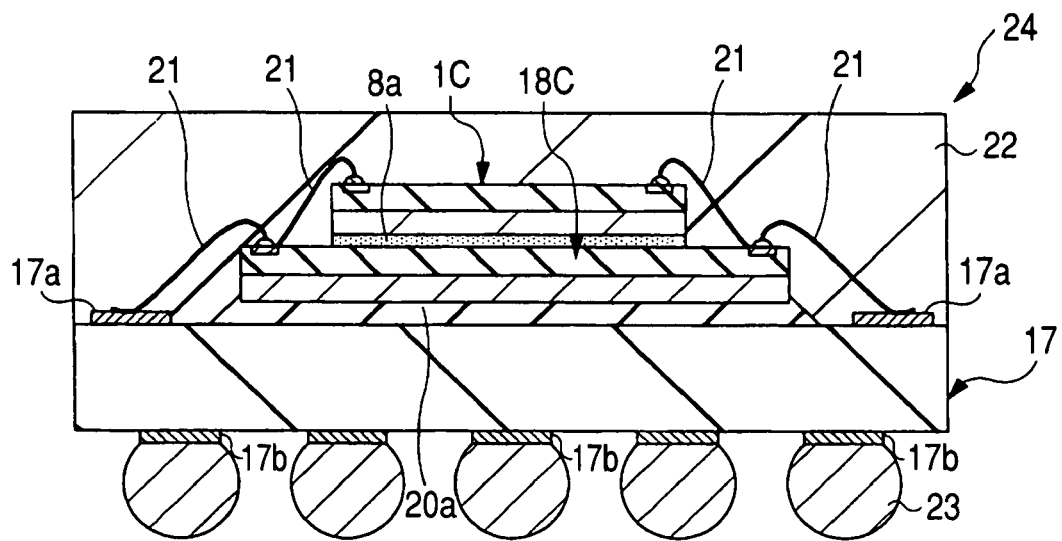
FIG. 14 is a sectional view showing a structural example after sealing with resin and formation of bumps in the semiconductor device manufacturing method of the first embodiment.

FIG. 1 is a manufacturing process flow chart showing an example of a method for forming a dicing tape used in a semiconductor device manufacturing method according to a first embodiment of the present invention, FIG. 2 is a sectional view showing a structural example wherein a jig is affixed to the dicing tape shown in FIG. 1, FIG. 3 is a plan view sowing a structural example of the dicing tape with jig shown in FIG. 2, FIG. 4 is a sectional view showing an example of assembling operations up to grinding of a back surface in the semiconductor device manufacturing method of the first embodiment, FIG. 5 is a sectional view showing an example of assembling operations up to wafer mounting in the semiconductor device manufacturing method of the first embodiment, FIG. 6 is a sectional view showing an example of assembling operations up to peeling-off of a protective tape in the semiconductor device manufacturing method of the first embodiment, FIG. 7 is a sectional view showing an example of assembling operations up to pickup in the semiconductor device manufacturing method of the first embodiment, and FIG. 8 is a plan view showing a structural example after laser dicing in the semiconductor device manufacturing method of the first embodiment. FIG. 9 is a plan view showing a structural example after expanding in the semiconductor device manufacturing method of the first embodiment, FIG. 10 is a perspective view showing a structural example of a pickup device used in the semiconductor device manufacturing method of the first embodiment, and FIG. 11 is a perspective view showing an example of a die bonding method used in the semiconductor device manufacturing method of the first embodiment. Further, FIG. 12 is a sectional view showing an example of a die bonding method for a second-stage chip in the semiconductor device manufacturing method of the first embodiment, FIG. 13 is a sectional view showing a structural example after wire bonding in the semiconductor device manufacturing method of the first embodiment, and FIG. 14 is a sectional view showing a structural example after sealing with resin and formation of bumps in the semiconductor device manufacturing method of the first embodiment.

The semiconductor device manufacturing method of this first embodiment is concerned with assembly of a semiconductor device having mounted thereon a thin semiconductor chip with a thickness of, for example, 50 μm or less.

First, a description will be given below about the structure and fabrication of a dicing tape 5 used in an expanding step and a die bonding step during assembly of the semiconductor device according to the first embodiment.

As shown in FIG. 1, the dicing tape 5 used in this first embodiment is of a two-layer structure comprising a first tape 5a having a first stretch ratio (elastic modulus) and a second tape 5b having a second stretch ratio (elastic modulus) lower than the first stretch ratio and disposed on the first tape 5a.

More specifically, the dicing tape 5 is of a two-layer structure comprising the first tape 5a high in stretch ratio and easy to stretch and the second tape 5b low in stretch ratio and difficult to stretch, the second tape 5b being disposed on the first tape 5a.

The first tape 5a is formed of resin such as polyolefin (PO) for example and the stretch ratio thereof is 50% to 200% for example.

On the other hand, the second tape 5b is formed using, for example, polyolefin (another polyolefin) having a stretch ratio of 20% or so or polyethylene terephthalate (PET). Thus, the first tape 5a is higher in stretch ratio and easier to stretch than the second tape 5b. The second tape 5b is difficult to stretch in comparison with the first tape 5a.

The stretch ratio is represented in terms of a percentage of stretching of an object from the original state when the object is stretched. For example, a 0% stretch ratio means that there occurs no stretching even when a tape stretching operation is performed. That is, the larger the value in question, the easier to stretch the tape, while the smaller the value in question, the more difficult to stretch. In the case of polyolefin (PO), the stretch ratio thereof can be controlled according to purposes of use and therefore it is possible to fabricate a tape higher in stretch ratio than a polyvinyl chloride (PVC) tape. However, in view of the material quality it is difficult to make the stretch ratio lower than that of polyethylene terephthalate (PET) and therefore it is preferable that polyethylene terephthalate (PET) low in stretch ratio be used as the material of the second tape 5b.

The second tape 5b is bonded onto the first tape 5a through an adhesive 5d and an adhesive 5d is bonding a jig is provided on a surface of the second tape 5b. That is, the adhesive 5d is provided on both surface and back surface of the second tape 5b. However, the adhesive 5d disposed between the first tape 5a and the second tape 5b need not always be used. More particularly, in the case where the first tape 5a and the second tape 5b are formed of homologous resins, the homologous resins can be connected together by intermolecular connection and therefore, in this case, the adhesive 5d present between the first and second tapes 5a, 5b may be omitted.

A circular aperture 5c is formed centrally of the second table 5b. As shown in FIG. 2, a semiconductor wafer 1W is disposed in the aperture 5c and, as shown in FIG. 5, a back surface 1Wb of the semiconductor wafer 1W and the first tape 5a of the dicing tape 5 are bonded together. That is, the semiconductor wafer 1W is bonded to the first tape 5a which is easy to stretch and contract, and the second tape 5b bonded to the first tape 5a and difficult to stretch is disposed along the outer periphery of the semiconductor wafer 1W.

In the aperture 5c of the second tape 5b the semiconductor wafer 1W is bonded to the first tape 5a through an adhesive layer. For example, a DAF (Die Attach Film) 4 as an adhesive layer is affixed to the first tape 5a in the tape area exposed to the aperture 5c of the second tape 5b. The DAF 4 is a die bonding material formed in the shape of a film.

Accordingly, it is preferable that the size of the aperture 5c of the second tape 5b be determined so as to allow margins taking a positional deviation at the time of affixing the DAF 4 and a positional deviation at the time of mounting the semiconductor wafer 1W into account. For example, in the case where the diameter (L) of the semiconductor wafer 1W is 300 mm, the diameter (M) of the DAF 4 is about 320 mm, and if a positional deviation at the time of affixing the DAF 4 and a positional deviation at the time of mounting the semiconductor wafer 1W are taken into account, the diameter (M+C+C) of the aperture 5c of the second tape 5b is in the range of 325 to 330 mm. That is, it is preferable for the aperture 5c to have a diameter about 5 to 10 mm larger than the diameter (M) of the DAF 4.

Next, the following description is provided about a method of fabricating the dicing tape 5 used in this first embodiment.

First, provision of DAF material shown in step S1 in FIG. 1 is performed. The DAF material provided comprises a base material 3 and a DAF 4 affixed thereto.

Thereafter, affixing of first/second tapes shown in step S2 is performed. More specifically, there are provided a first tape 5a having a first stretch ratio which is high and easy to stretch and a second tape 5b having a second stretch ratio lower than that of the first tape 5a and more difficult to stretch. Then, the second tape 5b with an adhesive 5d disposed on both surface and back surface of the tape is affixed onto the first tape 5a through the adhesive 5d. As a result, the adhesive 5d is exposed to the surface of the second tape 5b.

Thereafter, tape punching shown in step S3 is performed. More specifically, an aperture 5c is formed in only the second tape 5b by punching. It is preferable that the size of the aperture 5c be determined so as to allow margins taking a positional deviation at the time of affixing the DAF 4 and a positional deviation at the time of mounting the semiconductor wafer 1W into account.

Subsequently, affixing of DAF material shown in step S4 is performed. More specifically, the DAF 4 as affixed to the base material 3 is disposed within the aperture 5c of the second tape 5b and is affixed to the first tape 5a located within the aperture 5c.

Thereafter, removal of base material shown in step S5 is performed. More specifically, the base material 3 is peeled off from the DAF 4 affixed onto the first tape 5a to complete the fabrication of the dicing tape 5.

Next, a description will be given about the semiconductor device manufacturing method of this first embodiment. Here, reference will be made to such a chip stacked type CSP (Chip Size Package) 24 as shown in FIG. 14 as an example. In the CSP 24, thin semiconductor chips 1C and 18C are stacked within a package in order to attain the reduction in thickness of the package.

First, as shown in FIG. 1, there is provided a dicing tape 5, the dicing tape 5 comprising a first tape having a first stretch ratio which is high and easy to stretch and a second tape 5b having a second ratio lower than that of the first ratio and difficult to stretch. An aperture 5c slightly larger than the semiconductor wafer 1W is formed centrally of the second tape 5b and a DAF having a size and shape corresponding to that of the semiconductor wafer 1W is affixed to the aperture 5c.

Thereafter, as shown in FIG. 2, a ring-shaped jig 6 is affixed to the dicing tape 5. More specifically, the ring-shaped jig 6 is affixed onto the second tape 5b of the dicing tape 5 through an adhesive 5d. As shown in FIG. 3, the ring-shaped jig 6 is shaped along the peripheral edge portion of the second tape 5b.

It is preferable that the ring-shaped jig 6 be formed using metal such as, for example SUS (stainless steel). The diameter of a central aperture 6a of the ring-shaped jig 6 is set larger than the diameter of the aperture 5c of the second tape 5b. For example, as shown in FIG. 2, the aperture 6a is preferably formed so that a gap 9 between the inner periphery surface of the ring-shaped jig 6 and an end portion of the semiconductor wafer 1W is 20 mm or more in case of the wafer diameter being 300 mm.

In this case, for example, the distance (B) between the inner periphery surface of the ring-shaped jig 6 and an end portion of the semiconductor wafer 1W 300 mm in diameter is 20 to 25 mm, the distance (A) between an inner end portion of the second tape 5b and an end portion of the semiconductor wafer 1W is 12.5 to 15 mm, and thus both are in the relation of (B)>(A).

That is, when the semiconductor wafer 1W is disposed within the aperture 5c of the second tape 5b of the dicing tape 5 and is bonded to the first tape 5a, the bonded area of the semiconductor wafer 1W is only the area of the first tape 5a which is high in stretch ratio and is easy to stretch, while the area lying outside the area is the area where the second tape 5b low in stretch ratio and difficult to stretch and the first tape 5a are connected together. Thus, when the semiconductor wafer 1W is mounted on the dicing tape 5, the wafer 1W-bonded tape area is easy to stretch, while the outside tape area is difficult to stretch.

Then, affixing to a glass substrate of step S11 in FIG. 4 is performed. In this step, the semiconductor wafer 1W before grinding of its back surface is affixed to a glass substrate 13. More specifically, a main surface 1Wa of the semiconductor wafer 1W is affixed to the glass substrate 13 through UV resin 15. In this case, a release layer 13a is formed beforehand on a wafer bonding surface of the glass substrate 13.

Thereafter, back surface grinding of step S12 is performed. In this step, a back surface 1Wb of the semiconductor wafer 1W held by the glass substrate 13 is ground a predetermined quantity to reduce the thickness of the wafer.

Subsequently, a dicing laser beam is radiated in step S13 in FIG. 5. In this step, a laser beam 7 is radiated from the back surface 1Wb side of the semiconductor wafer 1W to a scribing area 1We of the semiconductor wafer to dice the wafer. By radiating the laser beam 7 to the scribing area 1We which is formed in a lattice shape, crushed layers 1Wd are formed in a lattice shape in the interior of the semiconductor wafer 1W, as shown in FIG. 8. The crushed layers 1Wd are each formed at a width of, for example, 2 to 3 μm.

Then, wafer mounting of step S14 is performed. In this step, the semiconductor wafer 1W is mounted on the dicing tape 5 through an adhesive layer. More specifically, the back surface 1Wb of the semiconductor wafer 1W is affixed to the DAF 4 disposed in the aperture 5c of the second tape 5b of the dicing tape 5.

Since the dicing tape 5 used in this first embodiment is of a two-layer structure comprising the first tape 5a easy to stretch and the second tape 5b difficult to stretch, the semiconductor wafer 1W-bonded tape area is easy to stretch, while the outside tape area is difficult to stretch.

Thereafter, a laser beam for the release of UV resin is radiated in step S15 in FIG. 6. In this step, the UV resin 15 is cured by laser scan 14 from above the glass substrate 13.

Subsequently, the glass substrate is peeled off in step S16. In this step, the glass substrate 13 is peeled off from the cured UV resin and is thereby removed from the semiconductor wafer 1W.

Then, the UV resin is peeled off in step S17. In this step, the cured UV resin is peeled off from the main surface 1Wa of the semiconductor wafer 1W.

Although in this embodiment the above description has been given about the case where the glass substrate 13 is affixed to the semiconductor wafer 1W, followed by back surface grinding, laser beam irradiation and wafer mounting, there may be adopted a method wherein a back surface grinding tape is affixed to the wafer and in this state there are performed back surface grinding, laser beam irradiation and wafer mounting. In this case, the back surface grinding tape is peeled off in step S17.

Thereafter, expanding of step S18 in FIG. 7 is performed. In this step, the dicing tape 5 is stretched from the outer periphery thereof to widen the chip-to-chip spacing.

In the expanding step, as shown in FIGS. 7 and 10, first the dicing tape 5 with the semiconductor wafer 1W bonded thereto is positioned horizontally onto a support ring 11 of a pickup device 10 and the ring-shaped jig 6 bonded to the peripheral edge portion of the dicing tape 5 is held by an expanding ring 12. As shown in step S19 in FIG. 7, a stick-up piece 16 for sticking up the semiconductor chip 1C is disposed inside the support ring 11.

Next, the expanding ring 12 of the pickup device 10 is brought down, whereby the ring-shaped jig 6 bonded to the peripheral edge portion of the dicing tape 5 is pushed down as in step S18 in FIG. 7. Once the ring-shaped jig 6 is forced down, the dicing tape 5 undergoes a strong tension acting from the central portion of the tape toward the peripheral portion (outer peripheral portion) and is thereby stretched without looseness in the horizontal direction. With this tension, chip areas 2 shown in FIG. 10 separate from one another along the crushed layers 1Wd formed in the scribing area 1We of the semiconductor wafer 1W. As a result, a plurality of individually divided semiconductor chips 1C are obtained.

At this time, the DAF 4 on the back surface 1Wb of the semiconductor wafer 1W is also stretched together with the dicing table 5 and is separated chip by chip, so that the DAF 4 of the same size as each of the divided semiconductor chips 1C remains on the back surface of the semiconductor chip.

In FIG. 7, an area (D) indicates a portion which is stretched by expanding, while an area (E) indicates a portion which is difficult to be stretched by expanding.

At the time of expanding in this embodiment, since the dicing tape 5 is stretched from the outer periphery thereof in a state in which the second tape 5b difficult to stretch is disposed along the outer periphery of the semiconductor wafer 1W, the stretching force for the dicing tape 5 can be transmitted positively to the area of the first tape 5a where the semiconductor wafer 1W is mounted. Further, since the area underlying the semiconductor wafer 1W is the area of the first tape 5a easy to stretch, it is possible to fully widen the spacing between adjacent chip-forming areas (chip areas 2) as shown in step S18 in FIG. 7.

That is, the second tape 5b difficult to stretch is disposed along the outer periphery of the semiconductor wafer 1W, so when the dicing tape 5 is stretched from its outer periphery, the tape area located between the ring-shaped jig 6 and the semiconductor wafer 1W is prevented from being stretched first and the stretching force for the dicing tape 5 can be transmitted positively without increasing the amount of expansion to the first tape 5a on which the semiconductor wafer 1W is mounted.

If the amount of expansion is increased too much, the dicing tape 5 may not revert to its original state, causing damage to the semiconductor chip 1C, upon removal of the dicing tape 5 from the pickup device 10. However, in the expanding operation performed this first embodiment, there is no fear of damage to the semiconductor chip 1C because the amount of expansion is not increased.

Thus, in the expanding operation performed in this first embodiment, even when laser dicing is conducted, it is possible to fully widen the spacing between adjacent chip-forming areas (chip areas 2), as shown in FIG. 9.

Consequently, in adopting the laser dicing method, the scribing area 1We of the semiconductor wafer 1W can be approximated to zero. More particularly, since the crushed layers 1Wd formed by radiation of the laser beam 7 is about 2 to 3 μm in width, it is no longer necessary to provide a scribing area as large as seven ten to several hundred μm on the semiconductor wafer 1W and it is possible to increase the number of semiconductor chips 1C obtained from the semiconductor wafer 1W.

It is preferable that expanding be carried out in the atmosphere of an ordinary temperature. If the dicing tape 5 is stretched under the application of heat thereto, the tape may be stretched to excess and unable to revert to its original state. Besides, the heat resistance of the first and second tapes 5a, 5b which constitute the dicing tape 5 is as low as 100° C. or lower because they are formed of polyolefin or polyethylene terephthalate. Therefore, by expanding the tape in the atmosphere of an ordinary temperature or in a cold environment (−20° C. to room temperature), the dicing tape 5 can be stretched without impairing its function.

Next, pickup of step S19 in FIG. 7 is performed. In this step, each of the individually divided semiconductor chips 1C is picked up from the dicing tape 5. More specifically, first the stick-up piece 16 is disposed under one semiconductor chip 1C and a pickup collet 19 able to chuck and hold the semiconductor chip 1C is disposed above the chip and is brought into close contact with the chip. Subsequently, ultraviolet light is radiated to the dicing tape 5 to cure the adhesive applied to the dicing tape, whereby the DAF 4 can be peeled off easily from the dicing tape 5.

Thereafter, the semiconductor chip 1C is pushed up by the stick-up piece 16 and the collet 19 is moved upward, causing the semiconductor chip 1C and DAF 4 to be peeled off from the dicing tape 5.

The semiconductor chip 1C thus peeled off and picked up from the dicing tape 5 is conveyed to the next step (pelletizing step) while being chucked and held by the collet 19 and is mounted onto a wiring substrate 17.

In this first embodiment, since the spacing between adjacent chip-forming areas (chip areas 2) can be fully widened by expanding, it is possible to diminish interference of adjacent chips when picking up the semiconductor chip 1C in die bonding. As a result, it is possible to increase a margin for such a defect as chip crack and hence possible to improve the reliability of CSP 24 (semiconductor device).

Even where a surface contact type flat collet cannot be used when picking up a semiconductor chip 1C for which a high reliability is required, the spacing between adjacent chip-forming areas (chip areas 2) can be fully widened by the expanding in this second embodiment, so it becomes possible to use a pyramidal collet 19 and hence possible to pick up the semiconductor chip 1C for which a high reliability is required.

Next, as shown in FIGS. 11 and 12, the semiconductor chip 1C thus picked up is conveyed onto a main surface of a semiconductor chip 18C mounted on a main surface of the wiring substrate 17. The semiconductor chip 18C is mounted a first-stage chip onto the main surface of the wiring substrate 17 through an adhesive layer 20a.

Subsequently, in a state in which an adhesive layer 8a on a back surface of the semiconductor chip 1C and the main surface of the semiconductor chip 1C are opposed to each other, the semiconductor chip 1C is brought down onto the main surface of the chip 18C. In this first embodiment the adhesive layer 8a corresponds to the DAF 4. That is, the semiconductor chip 1C is stacked (laminated) onto the semiconductor chip 18C through the adhesive layer 8a (DAF 4). The number of stages in the chip stack is not limited to two stages. Any other stages will do.

The wiring substrate 17 and the semiconductor chip 18 will now be described with respect to their constructions and an example of a method for mounting them. The wiring substrate 17 is constituted, for example, by a printed wiring substrate having a multi-layer wiring configuration and has a main surface and a back surface opposite to each other in the thickness direction. The semiconductor chip 18C is mounted on the main surface of the wiring substrate 17. Plural electrodes 17a are arranged on the main surface of the wiring substrate 17 so as to surround the outer periphery of the semiconductor chip 18C, while plural electrodes 17b are arranged on the back surface of the wiring substrate 17. The electrodes 17a on the main surface of the wiring substrate 17 and the electrodes 17b on the back surface of the wiring substrate are connected together electrically through inner-layer wiring lines in the wiring substrate 17. The electrodes 17a, 17b and the wiring lines in the wiring substrate 17 are formed of copper for example. Exposed surfaces of the electrodes 17a and 17b are plated with nickel (Ni) and gold (Au) as an undercoat.

A description will now be given about the configuration of the semiconductor chip 18C. A semiconductor substrate 18S of the semiconductor chip 18C, like a semiconductor substrate 1S of the semiconductor chip 1C, is formed of a single crystal of silicon (Si) for example, and elements and a wiring layer 18L are formed on a main surface of the semiconductor substrate 18S. The configuration of the wiring layer 18L is the same as that of a wiring layer 1L in the semiconductor chip 1C. Pads 18LB are formed in the top layer. The semiconductor chip 18C is mounted onto the main surface of the wiring substrate 17 in a state in which its main surface faces up and its back surface is fixed to the main surface of the wiring substrate 17 through the adhesive layer 20a. The adhesive layer 20a is formed of a thermoplastic resin such as, for example, polyimide resin.

DAF 4 may be used as the material of the adhesive layer 20a. That is, both the first-stage semiconductor chip 18C and the second-stage semiconductor chip IC may be mounted through the DAF 4.

Next, as shown in FIG. 13, pads 1LB of the second-stage semiconductor chip 1C and pads 18LB of the first-stage semiconductor chip 18C are connected together through conductive wires 21. Further, the pads 18LB of the first-stage semiconductor chip 18C and the electrodes 17a on the wiring substrate 17 are connected together through wires 21. The pads 1LB of the second-stage semiconductor chip 1C and the electrodes 17a on the wiring substrate 17 may be connected together through wires 21. The wires 21 is formed using, for example, gold (Au).

Subsequently, as shown in FIG. 14, the semiconductor chips 1C, 18C and plural wires 21 are sealed with resin. A sealing body 22 is formed using an epoxy resin or the like, for example, by the transfer molding method to seal the above components. Further, solder balls 23 serving as external terminals are formed on the electrodes 17b. For example, the solder balls 23 are formed using, for example, lead solder such as lead (Pb)-tin (Sn) or lead-free solder such as tin (Sn)-silver (Ag)-copper (Cu). In this way there is fabricated a CSP 24 (semiconductor device).

Second Embodiment

Figure 15:
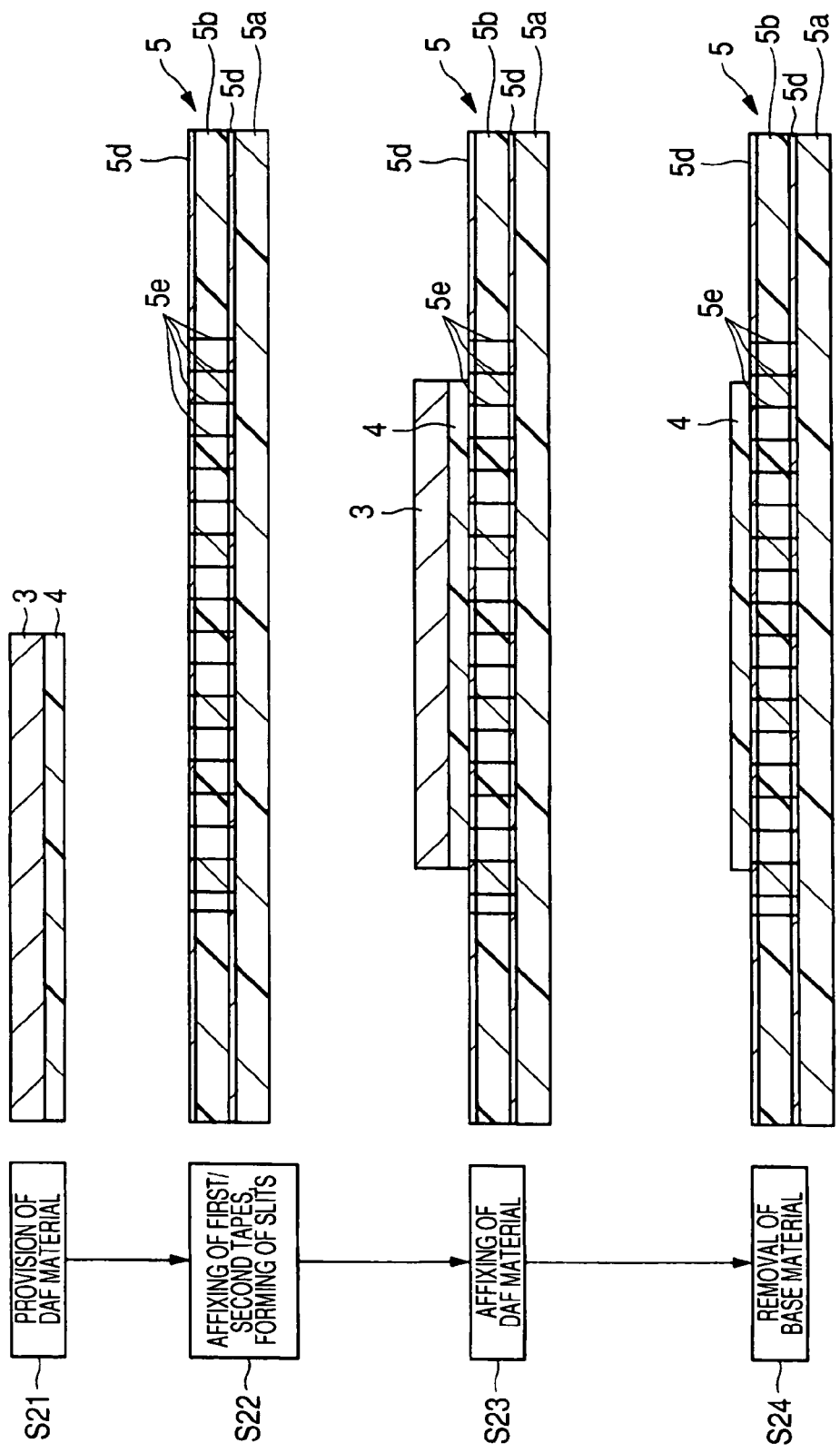
FIG. 15 is a manufacturing process flow chart showing an example of a dicing tape forming method used in a semiconductor device manufacturing method according to a second embodiment of the present invention.
Figure 16:
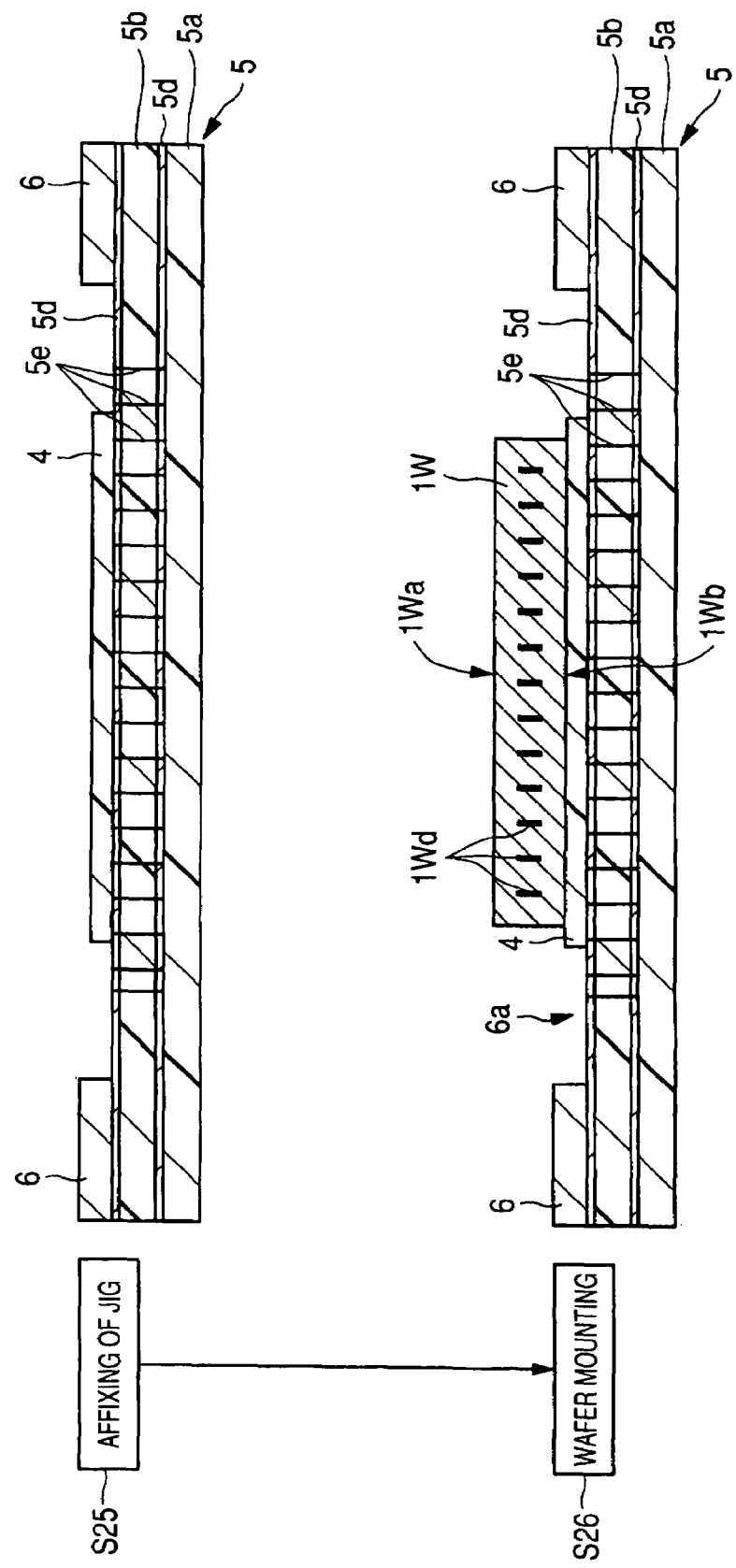
FIG. 16 is a sectional view showing a structure of a jig being affixed to the dicing tape shown in FIG. 15 and a wafer mounted structure.
Figure 17:
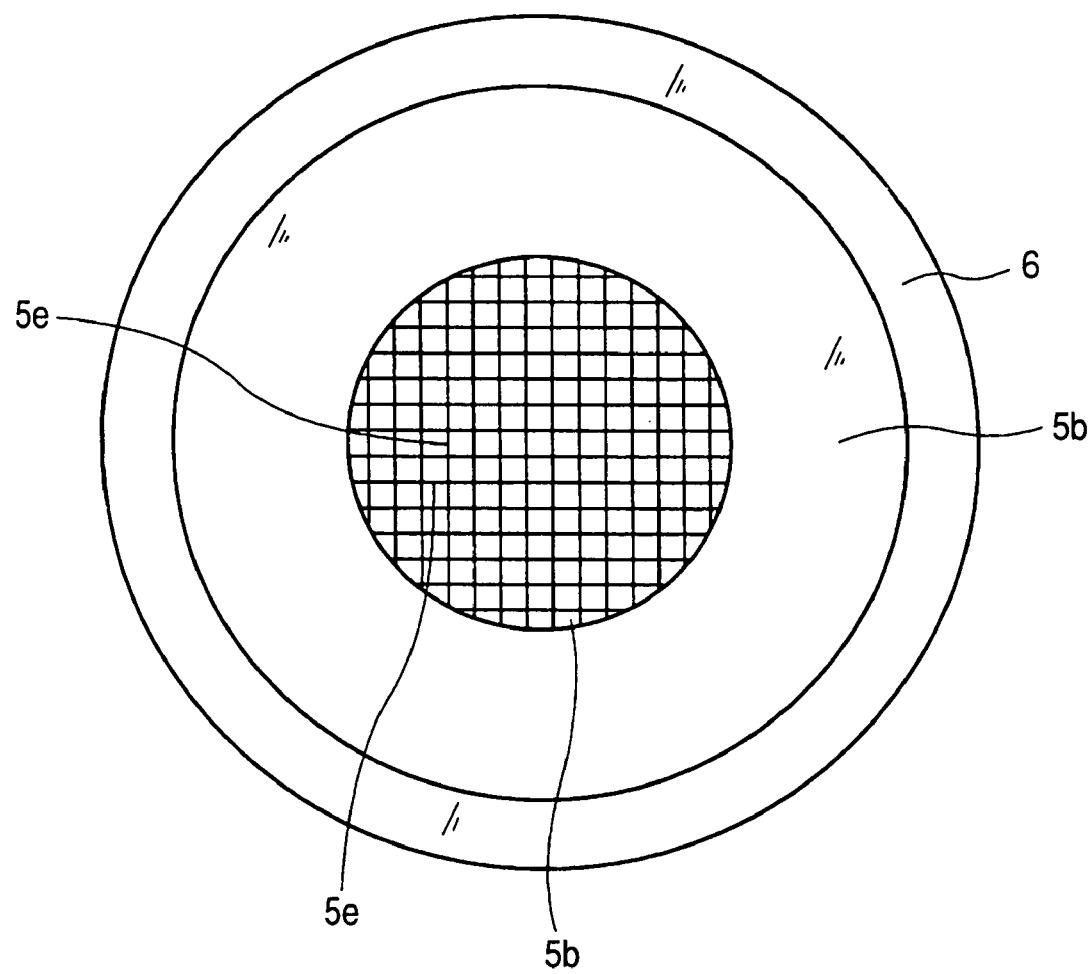
FIG. 17 is a plan view showing a structural example of the dicing tape with jig shown in FIG. 16.

FIG. 15 is a manufacturing process flow chart showing an example of a dicing tape forming method used in a semiconductor device manufacturing method according to a second embodiment of the present invention, FIG. 16 is a sectional view showing an example of a structure of a jig being affixed to the dicing tape shown in FIG. 15 and a wafer mounted structure, FIG. 17 is a plan view showing a structural-example of the dicing tape with jig shown in FIG. 16, and FIG. 18 is a sectional view showing an example of an expanding method and a pickup method both used in the semiconductor device manufacturing method of the second embodiment.

In this second embodiment, as shown in FIGS. 15 and 16, plural slits 5e are formed in a second tape 5b of a dicing tape 5 in a mounting area of the semiconductor wafer 1W, the dicing tape 5 being of a two-layer structure comprising a first tape 5a and a second tape 5b. That is, such an aperture 5c as described in the first embodiment is not formed in the second tape 5b, but instead plural slits 5e are formed in the semiconductor wafer 1W mounting area of the second tape 5b.

Since the plural slits 5e are formed in the semiconductor wafer 1W mounting area of the second tape 5b, when a force of pulling the tape from the tape outer periphery is exerted on the area of the second tape 5b, the slits 5e are split and the tape becomes easy to stretch. Therefore, the area located outside the semiconductor wafer 1W mounting area of the second tape 5b is difficult to stretch.

The material and stretch ratio of each of the first and second tapes 5a, 5b are the same as in the first embodiment. That is, the first tape 5a is high in stretch ratio and easy to stretch (e.g., polyolefin tape), while the-second tape 5b is low in stretch ratio and difficult to stretch (e.g., polyethylene terephthalate tape).

Thus, when the semiconductor wafer 1W is bonded onto the second tape 5b formed with plural slits 5e, the area which underlies the semiconductor wafer 1W is an area easy to stretch, while the area located outside the area is an area difficult to stretch. Therefore, when expanding the tape, the force of stretching the dicing tape 5 can be transmitted positively to the semiconductor wafer 1W mounted area of the second table 5b and thus it is possible to obtain the same effect as in the first embodiment.

As shown in FIG. 17, it is preferable that the plural slits 5e be formed in a lattice shape, more preferably in a finer lattice shape, correspondingly to the scribing area 1We (see FIG. 5) of the semiconductor wafer 1W. In the case where the plural slits 5e are formed in a finer lattice shape, the dicing tape 5 used in this second embodiment can be applied to semiconductor chips IC of various sizes.

The following description is now provided about a method of manufacturing the dicing tape 5 according to this second embodiment.

First, a DAF material is provided in step S21 in FIG. 15. In this step, there is provided a DAF material with DAF 4 affixed to a base material 3.

Thereafter, the first and second tapes are affixed together in step S22. In this step, there are provided a first tape 5a of a first stretch ratio which is high and easy to stretch and a second tape 5b of a second stretch ratio which is low and difficult to stretch, and the second tape 5b with an adhesive 5b provided on both surface and back surface of the tape is affixed onto the first tape 5a through the adhesive 5d. As a result, the adhesive is exposed to the surface of the second table 5b.

Subsequently, as shown in FIG. 17, plural slits 5e are formed in a lattice shape in an area of the second tape 5b where the semiconductor chip 1C is mounted. For example, the slits 5e are formed by transfer of a roll or the like. There may be adopted a method wherein a second tape 5b preformed with plural slits 5e is provided and thereafter the first and second tapes 5a, 5b are affixed to each other.

Then, affixing of the DAF material is performed in step S23. In this step, the DAF 4 affixed to the base material 3 is affixed onto the semiconductor wafer 1W mounting area of the second tape 5b.

Thereafter, the base material is removed in step S24. In this step, the base material 3 is peeled off from the DAF 4 affixed onto the second tape 5b to complete the fabrication of the dicing tape 5.

Next, the following description is provided about the semiconductor device manufacturing method of this second embodiment. A description will here be given about a mounting step of mounting the semiconductor wafer 1W to the dicing tape 5 after laser dicing, an expanding step and a pickup step. As to other steps, an explanation thereof is here omitted because they are the same as in the semiconductor device manufacturing method of the first embodiment.

First, a ring-shaped jig 6 is affixed to the dicing tape 5 in step S25 in FIG. 16. In this step, the ring-shaped jig 6 is affixed onto the second tape 5b of the dicing tape 5 through the adhesive 5d. The ring-shaped jig 6 is shaped along the peripheral edge portion of the second tape 5b, as shown in FIG. 17.

Thereafter, wafer mounting is performed in step S26. In this step, the semiconductor wafer 1W with crushed layers 1Wd formed by laser dicing is affixed to the DAF 4 on the second tape 5b of the dicing tape 5.

Subsequently, expanding is performed in step S27 in FIG. 28. In this expanding step, as in the first embodiment, the expanding ring 12 of the pickup device 10 shown in FIG. 10 is brought down to push down the ring-shaped jig 6 bonded to the peripheral edge portion of the dicing tape 5 as in step S27 in FIG. 18. Once the ring-shaped jig 6 is forced down, the dicing tape 5 undergoes a strong tension acting from the central part toward the peripheral part of the tape and is thereby stretched horizontally without looseness. With this tension, the chip areas 2 shown in FIG. 10 separate from each other along the crushed layers 1Wd formed in the scribing area 1W of the semiconductor wafer 1W. As a result, it is possible to obtain a plurality of individually divided semiconductor chips 1C.

Also in this second embodiment, as in the first embodiment, when expanding the dicing tape, since the plural slits 5e of the second tape 5b are present below the semiconductor wafer 1W, the dicing tape 5 is stretched from its outer periphery in a state in which the tape area with the slits 5e formed therein is easy to stretch and the area located outside the tape area is difficult to stretch. Consequently, the force of stretching the dicing tape 5 can be transmitted positively to the area of the second tape 5b where the semiconductor wafer 1W is mounted. Further, when the dicing tape 5 is stretched, the plural slits 5e are split in the area of the second tape 5b which underlies the semiconductor wafer 1W, and the first tape 5a easy to stretch underlies the second tape 5b, whereby it is possible to fully widen the spacing between adjacent chip-forming areas.

Next, pickup is performed in step S28 in FIG. 18. In this step, the individually divided semiconductor chips 1C are picked up from the dicing tape 5. First, the stick-up piece 16 is disposed under one semiconductor chip 1C and the pickup collet 19 able of chuck and hold the chip is disposed above the chip 1C and is brought into close contact with the chip. Subsequently, ultraviolet light is radiated to the dicing tape 5 to cure the adhesive applied to the dicing tape. As a result, the DAF 4 can be peeled off easily from the dicing tape 5.

Thereafter, the semiconductor chip 1C is pushed up by the stick-up piece 16 and the collet 19 is moved upward to peel off the semiconductor chip 1C and DAF 4 from the dicing tape 5.

The semiconductor chip 1C thus peeled off from the dicing tape 5 and picked up is conveyed to the next step (pelletizing step) while being chucked and held by the collet 19 and is mounted onto the wiring substrate 17, as shown in FIG. 11.

Also in the semiconductor device manufacturing method of this second embodiment, the force of stretching the dicing tape 5 from the outer periphery of the tape, at the time of expanding, can be transmitted positively to the second tape 5b where the semiconductor wafer 1W is mounted. Further, since the plural slits 5e of the second tape 5b are split and the first tape 5a easy to extend underlies the second tape 5b, it is possible to fully widen the spacing between adjacent chip-forming areas, whereby it is possible to diminish interference between adjacent chips at the time of picking up a semiconductor chip 1C in die bonding. As a result, it is possible to increase the margin for such a defect as chip crack and hence possible to improve the reliability of CSP 24 (semiconductor device).

Other effects obtained by the semiconductor device manufacturing method of this second embodiment are the same as in the first embodiment and therefore a tautological explanation thereof will be omitted.

Although the present invention has been described above concretely by way of embodiments thereof, it goes without saying that the present invention is not limited to the above embodiments, but that various changes may be made within the scope not departing from the gist of the invention.

For example, although in the above first and second embodiments the DAF 4 is affixed onto the dicing tape 5 and then the semiconductor wafer 1W is mounted onto the DAF 4, there may be adopted a method wherein the DAF 4 is affixed beforehand to the back surface 1Wb of the semiconductor wafer 1W and, after the irradiation of a dicing laser beam, the semiconductor wafer 1W with DAF 4 is mounted onto the dicing tape 5.

Further, although in the above first embodiment, when forming the dicing tape 5, the first and second tapes 5a, 5b are affixed together beforehand and thereafter DAF 4 is affixed to the dicing tape, the DAF 4 may be first affixed onto the first tape 5a as in such a modification as shown in FIG. 19. That is, there may be adopted a method wherein the DAF 4 is first affixed onto the first tape 5a (step S31), then, as in the second tape affixing of step S32, the second tape 5b formed with the aperture 5c is affixed from above to the DAF 4 so as to cover the outer periphery of the DAF, and thereafter the ring-shaped jig 6 is affixed to the second tape 5b as in the jig affixing of step S33.

In this case, it is not necessary to enhance the accuracy with respect to the size and affixing position of DAF 4 and the dicing tape 5 can be formed relatively easily.

The present invention is suitable for the semiconductor device manufacturing technique using a dicing tape.

What is claimed is:

1. A method of manufacturing a semiconductor device, comprising the steps of:
   (a) providing a dicing tape, the dicing tape comprising a first tape having a first stretch ratio and a second tape having a second stretch ratio lower than the first stretch ratio and provided on the first tape;
   (b) mounting a semiconductor wafer onto the dicing tape through an adhesive layer;
   (c) mounting a jig onto the dicing tape along an outer periphery of the semiconductor wafer;
   (d) dicing the semiconductor wafer; and
   (e) stretching the dicing tape from an outer periphery of the tape to widen a chip-to-chip spacing.

2. A method according to claim 1, wherein an aperture is formed in the second tape and the semiconductor wafer is disposed within the aperture and is bonded to the first tape.

3. A method according to claim 2, wherein the jig is in the shape of a ring and the diameter of the aperture of the jig is larger than that of the aperture of the second tape.

4. A method according to claim 1, wherein the semiconductor wafer is mounted on the second tape and a plurality of slits are formed in the semiconductor wafer-mounted area of the second tape.

5. A method according to claim 4, wherein the slits are formed in a lattice shape.

6. A method according to claim 1, wherein the adhesive layer is a DAF, the DAF being disposed on a back surface of the semiconductor wafer.

7. A method according to claim 1, wherein, in the step (d), a laser beam is radiated to a scribing area of the semiconductor wafer to dice the wafer.

8. A method according to claim 1, wherein a gap is formed between an inner periphery surface of the jig and an end portion of the semiconductor wafer.

9. A method according to claim 8, wherein the gap is 20 mm or larger.

10. A method according to claim 9, wherein the distance between the inner periphery surface of the jig and the end portion of the semiconductor wafer is longer than the distance between an inner end portion of the second tape and the end portion of the semiconductor wafer.

11. A method according to claim 1, wherein, in the step (e), the dicing tape is stretched from the outer periphery thereof in the atmosphere of an ordinary temperature.

12. A method according to claim 1, wherein the first tape is formed of a polyolefin and the second tape is formed of another polyolefin or polyethylene terephthalate.

13. A method according to claim 1, further comprising, after the step (e), the steps of:
   (f) picking up each individually divided semiconductor chips from the dicing tape;
   (g) mounting the picked-up semiconductor chip onto a substrate;
   (h) connecting electrodes on the semiconductor chip and electrodes on the substrate with each other through conductive wires; and
   (i) sealing the semiconductor chip and the wires with resin.

14. A method according to claim 13, wherein, in the step (g), a plurality of semiconductor chips are stacked onto the substrate.

* * * * *